US006678513B2

(12) United States Patent
Glasbrener et al.

(10) Patent No.: US 6,678,513 B2
(45) Date of Patent: Jan. 13, 2004

(54) NON-LINEAR TRANSISTOR CIRCUITS WITH THERMAL STABILITY

(75) Inventors: Michael W. Glasbrener, Santa Rosa, CA (US); Edward Lawrence, Marion, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 122 days.

(21) Appl. No.: 09/871,517

(22) Filed: May 31, 2001

(65) Prior Publication Data

US 2002/0183035 A1 Dec. 5, 2002

(51) Int. Cl.[7] ................................................ H04B 1/40
(52) U.S. Cl. ..................... 455/341; 455/127; 455/343; 320/256; 320/289
(58) Field of Search ............................... 455/341, 343, 455/122; 330/250, 256, 259, 261, 266, 267, 270, 272, 273, 289, 290

(56) References Cited

U.S. PATENT DOCUMENTS 5,629,648 A    5/1997  Pratt ........................... 330/289
5,877,564 A  * 3/1999  Kuiri ...................... 455/343 X
6,046,641 A  * 4/2000  Chawla et al. .......... 330/307 X

* cited by examiner

Primary Examiner—William Trost
Assistant Examiner—Philip J. Sobutka
(74) Attorney, Agent, or Firm—Thomas, Kayden, Horstemeyer & Risley, L.L.P.

(57) ABSTRACT

A non-linear transistor circuit uses separate signal biasing and DC biasing to improve the power efficiency while preventing thermal runaway. An improved amplifier using this circuit has a DC bias voltage supply. Using separate biasing of the DC supply voltage and the signal allows a large value resistance for the DC bias network to prevent thermal runaway and a small value resistance for the signal biasing network to improve the circuit's efficiency. A point of thermal equilibrium is reached when the voltage drop across the DC bias resistance sufficiently reduces the voltage between the transistor's base and emitter, $V_{BE}$, the base current, the collector current, and the junction temperature, resulting in thermal equilibrium.

17 Claims, 4 Drawing Sheets

NON-LINEAR TRANSISTOR CIRCUITS WITH THERMAL STABILITY

BACKGROUND OF THE INVENTION

1. Field of the Invention

The invention relates to non-linear transistor integrated circuits ("IC") with thermal stabilization.

2. Related Art

Portable electronic devices have become part of many aspects of personal, business, recreational, and other activities and tasks. As the popularity of various portable electronic devices, such as personal radio frequency ("RF") communication devices like portable phones, portable televisions, and personal pagers, increases, the demand for smaller, lighter, more powerful, and more power efficient electronics also increases.

There are two broad categories of transistor circuits: strongly non-linear and weakly non-linear. Strongly non-linear transistor circuits refer to circuits where distortion of the signal waveform is caused by the limiting behavior of the transistor's current ("I") and voltage ("V") characteristics. The I and V characteristics may be described with high-order power series expansion and non-continuous functions. High level or multiple-frequency excitation combined with these non-linearities may perturb the direct current ("DC") operating point of the transistor. Examples include strongly driven transistors and Schottky-barrier diodes because of their exponential I and V characteristics.

In contrast, weakly non-linear transistor circuits can be analyzed using a power series expansion of their non-linear I and V characteristics. The characteristics are considered to be continuous, have continuous derivatives, and do not require more than a few terms in the power series. The non-linearities and excitation signals are weak enough that the DC operating point is not perturbed. FIG. 1 sets forth a comparison of the transfer functions of a weakly non-linear 100 versus a strongly non-linear transistor circuit 110. An example of a strongly non-linear transistor circuit is a power amplifier commonly used in portable electronics.

Amplification of electronic signals is a function performed in many modern electronics communications systems. Amplification circuitry and devices tend to generate significant heat. Unfortunately, the packaging of these devices, especially within systems that have small form factors, tends to reduce the ability of these devices to dissipate heat through convection. The space surrounding these devices has also become significantly more confined as packaging size shrinks, thus reducing the opportunity for convection currents to circulate and remove heat. The packaging of these devices comprises, in significant part, materials such as plastics that are generally lighter than metal packaging. Plastics generally tend to have a greater thermal resistance to heat transfer in comparison to metals. The opportunity for heat transfer and thereby cooling of the power amplifier via conduction may be significantly reduced with the increased usage of non-metallic materials Some manufacturers of these devices have taken the approach of adding metal heat-sinks to their devices. Unfortunately, the effectiveness of heat-sinking diminishes as the air volume available for convection cooling decreases. Some devices are designed to withstand higher temperatures. But, as packages become smaller, the heating of adjacent devices increases, which may tend to increase heat dissipation and reduce the reliability of the devices.

Typically, heterojunction bipolar transistors ("HBT") enable more efficient RF power amplification than other semiconductor devices in IC format because of the high power density and the high breakdown voltage of the HBT devices. For high power designs, a multitude of matched HBTs are connected in parallel forming a large array of transistors. This allows even distribution of the heat generated within each transistor (self-heating) over a sufficient area such that excessive heating does not degrade the performance or reliability of the amplifier.

Under ideal conditions, the current is distributed equally through the many matched HBTs, thus preventing excessive localized self-heating within individual transistors. Unfortunately, traditional wafer fabrication processes have drawbacks, and there can be mismatches between individual HBTs. If the HBTs are mismatched, one HBT will draw a higher collector current and operate at a higher temperature than the other(s). The high collector current increases the junction power dissipation. This causes the junction temperature to rise, which further increases the collector current. Unless properly constructed, this phenomenon of "thermal runaway" can cause undesirable permanent damage to the transistor and, therefore, the amplifier.

Thermal runaway results when one HBT fails, causing a chain reaction failure of other components. Unfortunately, small differences in device construction or placement within the IC can cause uneven heating between individual devices. Any device that is connected in parallel with other similar devices and that is hotter than its neighbors will tend to draw more current and heat itself even more, The heating compounds, and the result is a thermal runaway phenomenon that will destroy the HBTs and eventually the amplifier.

Previous attempts to avoid thermal runaway use a single resistance in series with the emitter of each transistor. Usually, the ballast resistances degenerate the DC and RF gain of the transistors such that the increased collector current tends to increase the emitter voltage and thus decreases the emitter-base bias voltage. This reduces the collector current. Typically, thermal stability may be improved by making the ballast resistances large, however, this degrades the RF gain and efficiency of the amplifier. In order to achieve thermal stability, another element, such as an isolation capacitor, may be placed in series with the amplifier. It may be desired that as much power from the DC power supply as possible be transformed into RF power at the output of the amplifier. Any power consumed by the amplifier is wasted and decreases its efficiency.

In addition, the DC and alternating current ("AC") collector current that drives the amplifier's output passes through the ballast resistances. Therefore, significant power is dissipated in the ballast resistances. Because this amplifier is typically fabricated using gallium arsenide ("GaAs"), which is a poor heat conductor, the ballast resistances are typically quite large. Unfortunately, a large ballast resistance degrades the efficiency.

Use of a single resistance in series with the base of each transistor of the amplifier may be used in an attempt to avoid thermal runaway. However, making the base ballast resistance large enough to prevent thermal runaway may result in significant power gain degradation. A small value for the base ballast resistance combined with operating at a slightly higher temperature results in each transistor operating at a higher junction temperature and subsequently higher base current, $I_b$, and collector current, $I_c$. The physics of the semiconductor junction indicate that, at a higher operating temperature, a lower base to emitter voltage, $V_{BE}$, is required to produce the same base current. Lowering the value of the base ballast resistance does not allow a sufficient voltage drop between the DC bias voltage and $V_{BE}$ to achieve thermal equilibrium. As a result, this higher voltage causes $I_b$ and $I_c$ to increase, power dissipation to increase, and temperature to increase. As the temperature continues to increase, and $V_{BE}$ is not reduced enough to achieve equilibrium, the process continues until the transistor is destroyed along with the surrounding circuitry. Thus, there is a need for a thermally stable strongly non-linear transistor circuit.

SUMMARY

The invention provides a non-linear transistor circuit that has improved thermal stability and improved power efficiency. This circuit includes elements that maintain a constant current to the transistor's base. In particular, the invention provides a power amplifier that uses separate RF biasing and DC biasing to improve the power efficiency while preventing thermal runaway.

The improved amplifier receives a DC bias voltage supply from any of a number of known sources and includes an RF input port that receives an RF signal to be amplified. A plurality of DC biasing networks are connected to the DC bias voltage supply. Each DC biasing network comprises a resistance large enough to provide thermal stability to the amplifier. A plurality of RF biasing networks are connected to the RF input port. Each RF biasing network comprises a resistance and a capacitance connected in series such that the value of the resistance is small enough to maximize the amplifier gain. The capacitance serves to electrically isolate each transistor. Each DC biasing network and each RF biasing network is connected to a corresponding amplifying transistor. Each transistor is then connected to a common output.

In the case of mismatched transistors, if one transistor is operating at a slightly higher junction temperature and has a subsequently higher $I_b$, a higher voltage drop across the large value of the DC bias resistance, $R_b$, will result. A point of thermal equilibrium is reached when the voltage drop across the DC bias resistance, $R_b$, sufficiently reduces the voltage between the transistor's base and emitter, $V_{BE}$, hence reducing $I_b$ and $I_c$, and therefore, sufficiently reducing the junction temperature. The DC bias resistances are large enough such that each of the DC bias resistances thermally stabilizes each of the corresponding transistors.

The DC bias voltage and the RF signal to be amplified are supplied to the amplifier. The DC bias voltage is supplied to the plurality of DC bias resistances, that output a modified DC bias voltage. The RF signal is supplied to the RF bias network, which outputs a modified RF signal. The modified signals are then supplied to each of the corresponding transistors that amplify the modified RF signals. All of the amplified RF signals are then supplied to a common RF output port.

Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The components in the figures are not necessarily to scale, emphasis being placed upon illustrating the principals of the invention. In the figures, like reference numerals designate corresponding parts throughout different views.

DETAILED DESCRIPTION

Figure 1:
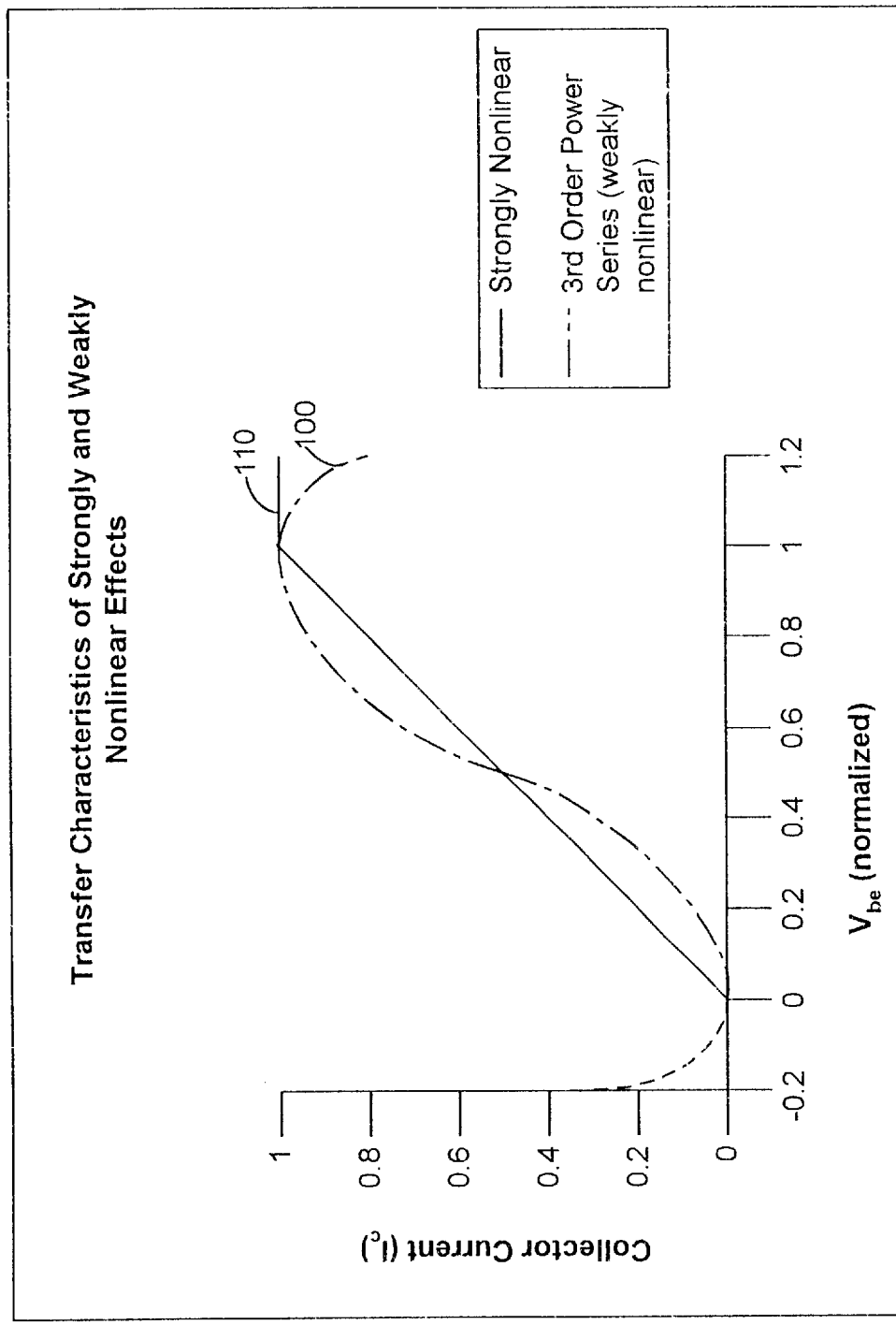
FIG. 1 is an illustration of transfer functions of nonlinear circuits.
Figure 2:
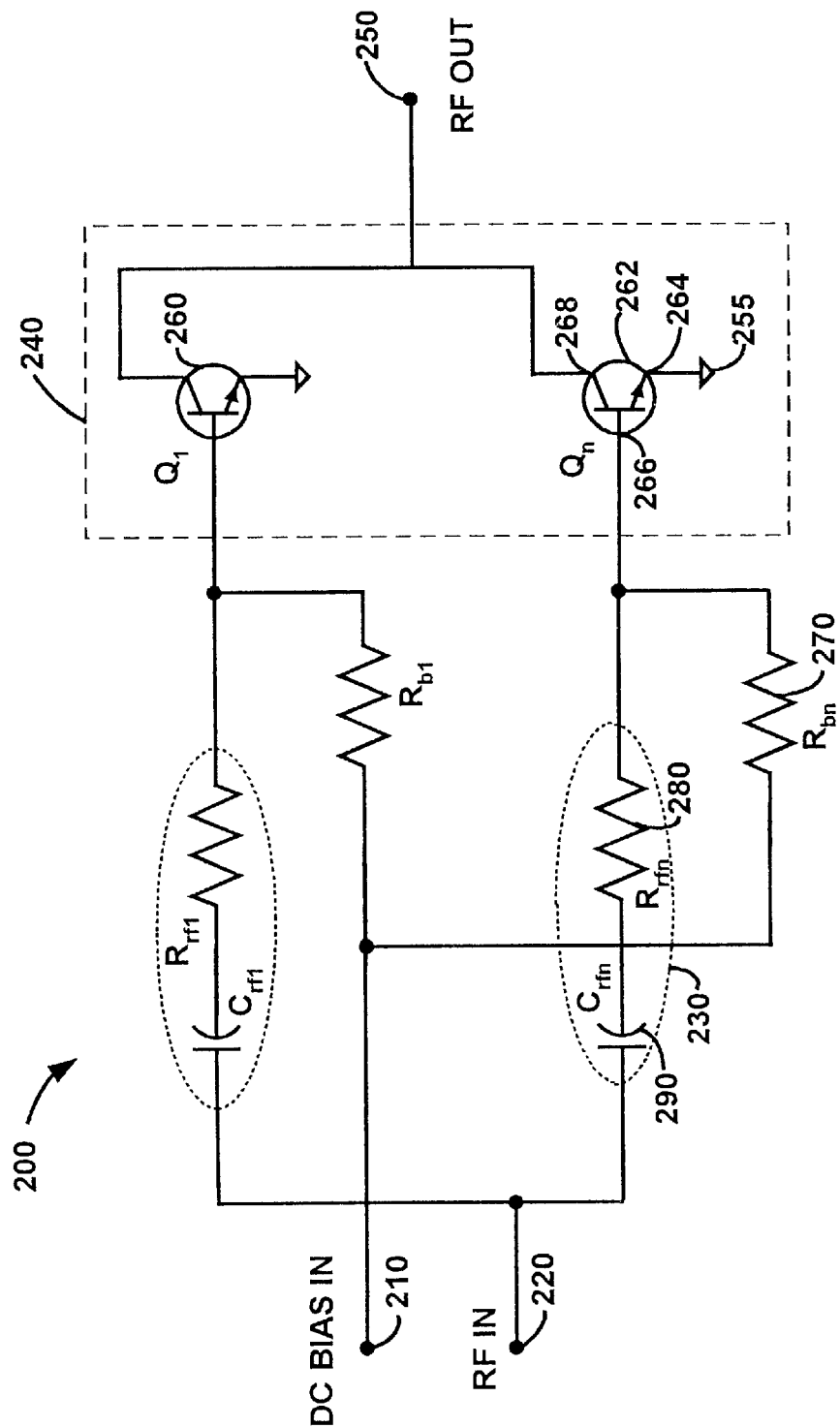
FIG. 2 is an illustration of an embodiment of a nonlinear transistor circuit.

An exemplar embodiment of the current invention is depicted in FIG. 2, which sets forth a strongly non-linear circuit such as a power amplifier circuit 200. Other examples of strongly non-linear transistor circuits are driver circuits, voltage controlled oscillators (VCO), etc. The power amplifier circuit 200 maximizes power gain and efficiency, prevents thermal runaway, and maintains thermal equilibrium. The power amplifier circuit 200 comprises a DC bias input port 210, a RF input port 220, DC biasing components 230, an amplifier array of transistors 240, and a RF output port 250.

The DC bias input port 210 receives the necessary power for amplification. This DC bias input port 210 is connected to a DC voltage source (not shown). The DC voltage source can be one of many known to one of ordinary skill in the art. The RF input port 220 provides the RF signal to be amplified.

The amplifier array 240 comprises a plurality of n transistors, $Q_1$–$Q_n$, examples of which are indicated using reference numbers 260 and 262. As each transistor is similar, one transistor $Q_n$ 262 will be described in detail. It should be understood that the description of $Q_n$ 262 applies to each of the plurality of n transistors. The transistor $Q_n$ 262 includes an emitter 264, a base 266, and a collector 268. The emitter 264 is connected to a common electrical ground 255. The collector 268 is connected to the RF output port 250. The base 266 is connected to respective biasing components.

The biasing components include an n plurality of DC bias resistances $R_{bn}$ 270 and an n plurality of RF biasing networks 230, each comprising a RF biasing resistance $R_{rfn}$ 280 and a RF biasing capacitance $C_{rfn}$ 290 connected in series. The DC bias resistance $R_{bn}$ 270 is a large value resistance connected between the DC bias voltage source 210 and the base 266 of each transistor $Q_n$ 262 and provides a modified DC bias voltage and prevents thermal runaway. The RF biasing network 230 is connected between the RF input port 220 and the base 266 of each transistor $Q_n$ 262. The RF biasing capacitance $C_{rfn}$ 290 DC isolates the transistor $Q_2$ 262 from the RF input port 220 and from each of the other transistors within the amplifier array 240. The RF biasing resistance $R_{rfn}$ 280 is a small value resistance that improves the power gain.

To prevent thermal runaway and maximize power amplification, the current (I) consumption differences between individual transistors should be minimized, or the effects of the differences minimized. These differences are a result of the limitations of the wafer manufacturing process to produce electrically identical transistors and also the non-uniform distribution of heat over the area of the array of transistors. Such differences can cause individual transistors to draw different current levels. The collector current ($I_c$) of each transistor is proportional to the voltage across the base and emitter, $V_{BE}$. The $V_{BE}$, for a given $I_c$, decreases as the temperature rises. Thermal instabilities occur when $V_{BE}$ remains constant, which is the case for very small values of base resistance. If the temperature increases, $I_c$ increases, which causes an increase in power dissipation and self-heating in the transistor. Normally, this would cause $V_{BE}$ to decrease. However, because $V_{BE}$ is held constant, the increases in both $I_c$ and self-heating continue unchecked until the transistor and the circuit are destroyed.

To thermally stabilize the circuit, the invention uses separate biasing for the RF input port 220 and the DC bias voltage source 210. Prior art amplifier systems use a single resistance between each transistor and the RF input port and the DC bias voltage source combined to both maximize the efficiency and thermally stabilize the amplifier. These goals can lead to compromises in choosing the value of the prior art resistance. To provide maximum efficiency, the prior art single resistance should be maximized. Likewise, to control thermal runaway, the prior art single resistance should be minimized. This resulted in a resistance value somewhere between the two optimums. By separately biasing the RF input port 220 and the DC bias voltage source 210, the RF biasing resistance $R_{rfn}$ 280 can be minimized, and the DC bias resistance $R_{bn}$ 270 can be maximized. Maximizing the DC bias resistance $R_{bn}$ 270 provides the desired thermal protection.

To reach thermal equilibrium, assume the transistor $Q_n$ 262 is operating at a slightly higher temperature than surrounding transistors, which increases the base current $(I_b)$ drawn by the transistor 262. The increase in base current, in turn causes the voltage drop across $R_{bn}$ 270 to increase. This voltage drop reduces $V_{BE}$ and also decreases $I_c$, which reduces the power dissipation and, therefore, operating temperature. In this manner, thermal equilibrium is achieved.

For example, the value of $R_{bn}$ 270 can exceed approximately 1000 ohms and the value of $R_{rfn}$ 280 can exceed approximately 70 ohms. These values, however, are dependent upon the number of transistors in the amplifier array and upon the individual operating characteristics of each transistor. It has been shown that the value of $R_{bn}$ 270 should be greater than approximately 300 ohms and that the value of $R_{rfn}$ 280 should be greater than approximately 30 ohms. However, it would be obvious to one of ordinary skill in the art to optimize the value of the resistances and capacitances to achieve optimum performance.

The amplifier can be constructed using known gallium arsenide (GaAs) fabrication techniques. In addition, other known construction techniques can be used for varying applications. Fabricating this amplifier circuit in GaAs has several benefits. The material choice allows smaller components, and therefore a smaller IC as a finished product. Also, because of the reduction in size and other material properties, GaAs IC chips require less current to operate. This is especially important when working with RF signals because less current results in less noise being added to the amplified RF signal.

Although the transistors are typically HBTs, the invention is also applicable to other bipolar semiconductor technology or any other technology having the characteristics of decreasing $V_{BE}$ versus temperature and/or increasing current gain versus temperature. HBTs can be constructed using GaAs, silicon germanium (SiGe), and indium gallium phosphide (InGaP) processing technologies. Other known types of amplifier systems based upon parallel transistors using silicon (Si) bipolar technology can also be fabricated using the principles of this invention. HBTs have certain advantages as they require less current for operation and are therefore less noisy. However, other known types of amplifier systems based upon parallel transistors or even vacuum tubes can be fabricated using the principles of this invention.

The invention prevents thermal runaway by maintaining a constant $I_c$ independent of $V_{BE}$ and temperature. Using HBT technology, a large DC bias resistance $R_{bn}$ 270 minimizes the effects of thermal runaway. For other technologies, such as silicon, etc., a properly designed, linearly dependent voltage/current source can be used in place of the DC bias resistance $R_{bn}$ 270. The resistances can be constructed using conventional thin film techniques and could also be diffused or implanted. Again, other known resistances can be used depending upon the individual application.

The capacitances can be two metal insulator layered capacitors. These capacitances could also be a multiple layer type system that increases the capacitance per area. Additionally, interdigitated capacitances, which are multi-finger structure that uses the capacitance that occurs across the gap on thin-film conductors, could be used, The gap meanders back and forth in a rectangular area forming two sets of fingers that are interdigital. By using a long gap in a small area, compact single-layer small-valued capacitors can be realized. This type of capacitor can be fabricated using a conventional integrated circuit fabricated using monolithic microwave integrated circuit (MMIC) technology. Other types of capacitances could be used depending upon the individual application.

The amplifier of the invention can be a RF amplifier that may be used in a variety of wireless communications electronics, as well as non-communication electronics. Thus, embodiments of this invention may involve various types of systems. However, for the purposes of simplifying the disclosure, particular embodiments of the invention are described in relation to personal wireless communication systems including, but not limited to, mobile telephones, cordless telephones, mobile transmitters, stationary wireless transmitters, personal digital assistants, wireless modems, pagers, wireless fax machines, and other battery operated devices. Examples of non-portable applications include modems, cable modems, fax machines, base stations, landline based applications, computer networks, and the like. Such personal communication systems typically include one or more portable or remotely located receiver and transmitter units that are powered by batteries. In most applications, it is desirable to minimize the power requirements, size, weight, and cost of such receiver/transmitter units, for example, to improve portability, and increase the usage time between power recharges.

Figure 3:
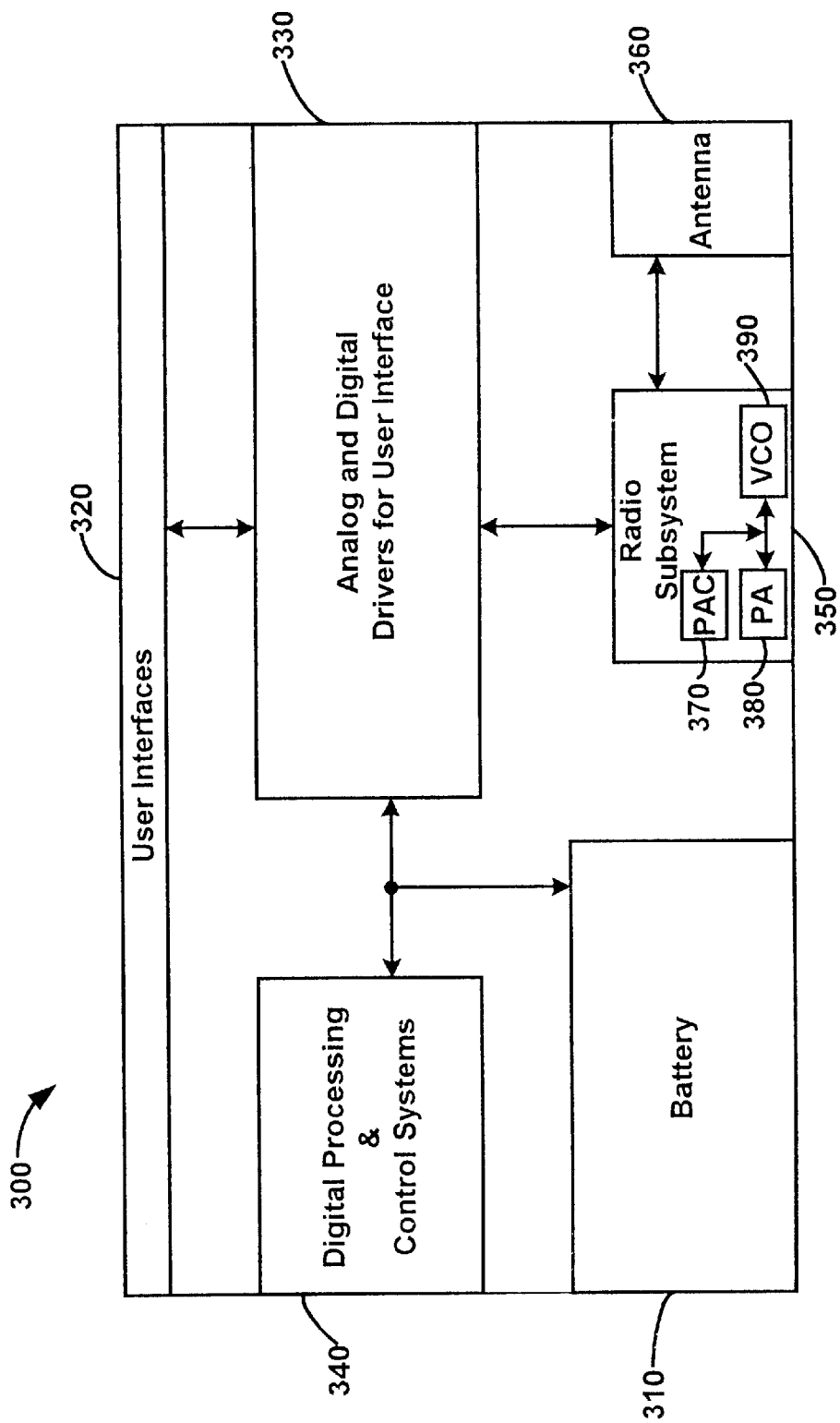
FIG. 3 is an illustration of a wireless communication device employing the nonlinear transistor circuit of FIG. 2.

FIG. 3 sets forth a block diagram of an example wireless communication device 300. The wireless communication device 300 may include a battery 310; a set of user interfaces 320, including a microphone, a speaker, a keyboard, and a display (not shown); a set of analog and/or digital device drivers 330 for the user interfaces 320; digital processing and control systems 340; a radio subsystem 350; and an antenna 360. The antenna can be one of many forms of signal transducers that convert waves into electrical signals. The antenna can be a dipole antenna, spiral antenna, etc., as well known to one of ordinary skill in the art. Each of the subsystems within the wireless communication device 300 are interrelated and provide power and control to each other. The battery 310 initially provides power to both the analog and digital drivers 330 and the digital processing and control systems 340. The analog and digital drivers 330 control the user interfaces 320 as well as the radio subsystem 350. The radio subsystem 350 includes interrelated components such as the power amplifier 380, a power amplifier controller 370, and a voltage controlled oscillator 390. The power amplifier 380 used within the radio subsystem 350 provides output power for transmission. The radio subsystem 350 includes a variety of passive and active RF components for transmission and reception. These radio subsystem components are all provided on an RF board.

Figure 4:
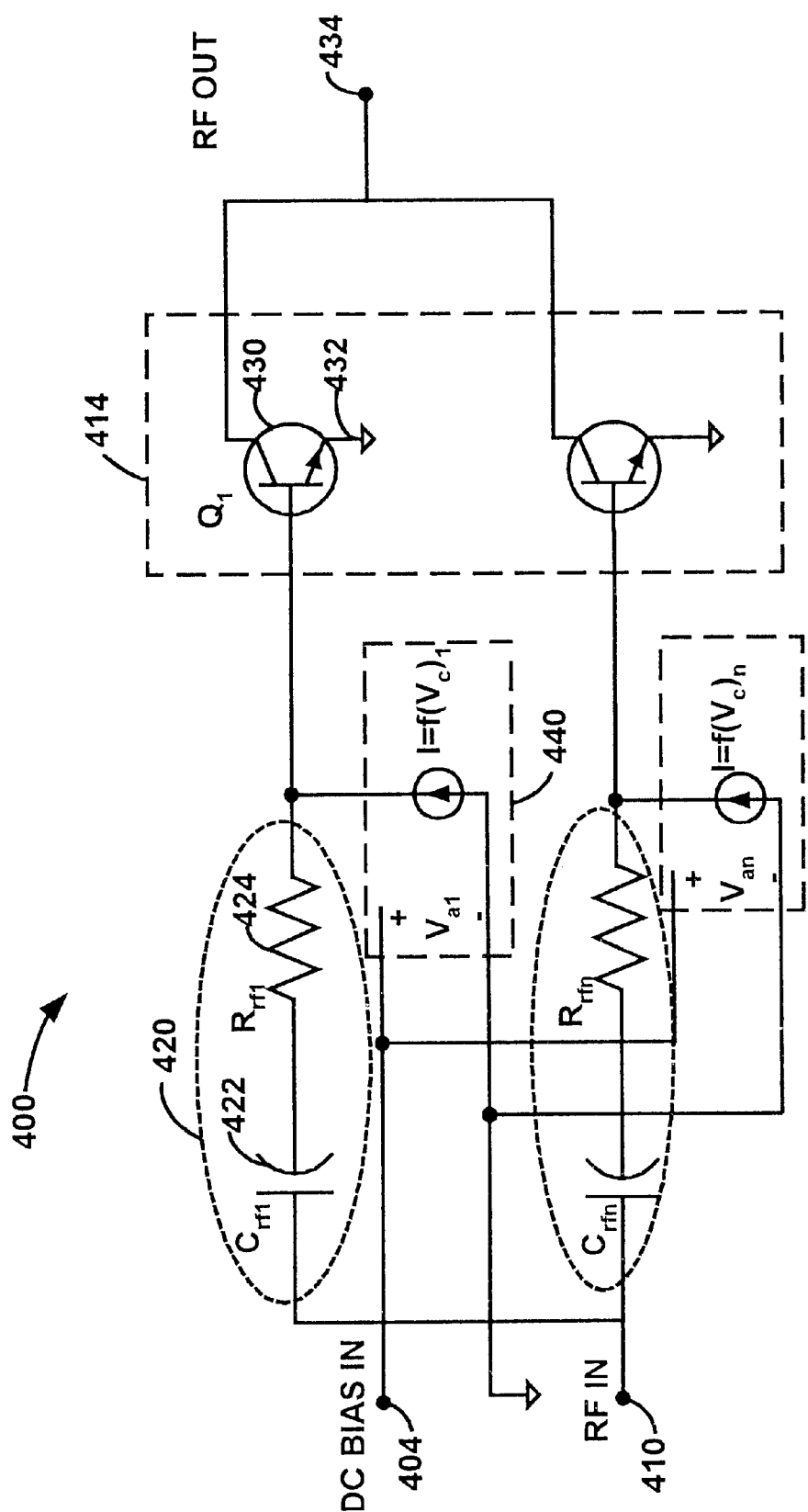
FIG. 4 is an illustration of an alternative embodiment of the non-linear transistor circuit of FIG. 2.

FIG. 4 sets forth an alternative embodiment of the strongly non-linear transistor circuit of the invention. FIG. 4 sets forth a power amplifier 400 comprising a DC bias input voltage 404 and an RF input signal 410. The RF input signal 410 is connected to each of n transistors of the amplifier stage 414 via n RF bias networks 420. As each transistor is similar, the following will be described with regard to an exemplar transistor as indicated by reference number 430. In this example, the RF input signal 410 is connected to the transistor 430 via the RF bias network 420. Each RF bias network 420 comprises a RF bias capacitance $C_{rfn}$ 422 and a RF bias resistance $R_{rfn}$ 424. The transistors of the amplifier stage 414 are commonly connected to a common electrical ground 432 and a common RF output 434 as described above. The DC bias input voltage 404 is connected to the transistor 430 via a linear voltage controlled current source 440. The linear voltage controlled current source 440 provides thermal stability to this circuit 400 by providing a bias current that is independent of the transistor voltages and temperature.

With the explosion of hand held communication systems on the market, manufacturers are striving to further decrease the size and weight of these systems as well as extend the battery life. Because the battery powers the system and is a large source of both size and weight, manufacturers try to minimize battery size while maximizing battery life between chargings. By maintaining thermal stability independently via the DC bias resistance or by providing an independent current source, the power efficiency is increased without increasing the potential for damage to the system or increasing the battery power consumption.

While various embodiments of the invention have been described, it will be apparent to those of ordinary skill in the art that many more embodiments and implementations are possible that are within the scope of this invention.

What is claimed is:

1. A power amplifier circuit, comprising:
   an amplifier array comprising a plurality of amplifying transistors, where the amplifier array is connected to an output and supplies an amplified signal to the output;
   a plurality of bias resistances, where the plurality of bias resistances correspond to the plurality of amplifying transistors, where each bias resistance is connected to a source input and to each corresponding amplifying transistor, where each bias resistance is sized to maintain a stable operating temperature of the amplifier array; and
   a plurality of bias networks, the plurality of bias networks corresponding so the plurality of amplifying transistors, where each bias network comprises a resistance and a capacitance in series, where each bias network is connected to a signal input and to the corresponding amplifying transistor, and where each bias network is sized to maximize efficiency.

2. The circuit of claim 1, wherein each of the plurality of amplifying transistors comprises at least a first connection point, where each amplifying transistor is connected via each first connection point to the corresponding bias resistance and the corresponding bias network.

3. The circuit of claim 1, wherein the power amplifier circuit is embodied in en integrated circuit, the integrated circuit being fabricated from a material system chosen from the group consisting of gallium arsenide, silicon germanium, and indium gallium phosphide.

4. A signal processing system, comprising:
   means for outputting a bias voltage;
   means for receiving and outputting a signal;
   means for processing the signal and outputting a processed signal, the processing means comprising a means for amplifying the signal where the amplifying means comprises a plurality of amplifying transistors, each transistor having at least a first connecting point, where each amplifying transistor is connected via the first a connecting point to a signal delivering means and to a bias voltage delivering means, where the bias voltage is a direct current (DC) bias voltage, and where the signal is a radio frequency (RF) signal;
   means for efficiently delivering the signal from the receiving means to the processing means, the means for delivering the RF signal comprising a plurality of RF bias networks, where each RF bias network comprises a resistance and a capacitance connected in series, and where the plurality of RF bias networks corresponds to the plurality of amplifying transistors; and
   means for delivering the bias voltage to the processing means and maintaining a stable operating temperature.

5. The system of claim 4, wherein the means for delivering the DC bias voltage comprises a plurality of DC bias resistances, where the plurality of DC bias resistances corresponds to the plurality of amplifying transistors, and where the plurality of DC bias resistances maintains the stable operating temperature.

6. The system of claim 4, wherein the amplifying means is embodied in an integrated circuit, the integrated circuit being fabricated from a material system chosen from the group consisting of gallium arsenide, silicon germanium, and indium-gallium phosphide.

7. A communication system, comprising:
   means for converting between electromagnetic waves and a signal;
   means for processing the signal;
   means for power amplifying the signal, the amplifying means coupled to the processing means, the converting means coupled to the amplifying means, the amplifying means comprising:
   means for outputting the DC bias voltage;
   means for receiving and outputting the signal;
   means for delivering the signal, coupled to the receiving means; and
   means for amplifying the signal where the amplifying means comprises a plurality of amplifying transistors, each transistor having at least a first connecting point, where each amplifying transistor is connected via the first connecting point to the signal delivering means and the DC bias delivering means; and
   where the amplifying means further comprises means for operating at an optimal stable operating temperature, the operating means comprising means for delivering a direct current (DC) bias voltage.

8. The communication system of claim 7, wherein the means for maintaining an optimal and stable operating temperature comprises a plurality of DC bias resistances, where the plurality of DC bias resistances correspond to the plurality of amplifying transistors.

9. The communication system of claim 8, wherein the processing means comprises a RF transmitter;

where the processing means outputs the RF signal to the amplifying means, the amplifying means amplifies the RF signal and outputs an amplified RF signal to the converting means; and where the convening means converts the amplified RF signal to electromagnetic waves.

10. The communication system of claim 9, wherein the processing means further comprises a RF receiver;

where the converting means converts the electromagnetic waves to an RF signal and outputs the RF signal to the amplifying means; and where the amplifying means amplifies the RF signal, and outputs an amplified RF signal to the processing means.

11. The communication system of claim 7, wherein the amplifying means is embodied in an integrated circuit, the integrated circuit being fabricated from a material system being chosen from the group consisting of gallium arsenide, silicon germanium, and indium gallium phosphide.

12. The communication system of claim 7, wherein the processing means comprises a RF transmitter;

where the processing means outputs the RF signal to the amplifying means, the amplifying means amplifies the RF signal and outputs an amplified RF signal to the converting means; and where the convening means converts the amplified RF signal to electromagnetic waves.

13. The communication system of claim 12, wherein the processing means further comprises a RF receiver;

where the converting means converts the electromagnetic waves to an RF signal and outputs the RF signal to the amplifying means; and where the amplifying means amplifies the RF signal, and outputs an amplified RF signal to the processing means.

14. A method of efficiently processing a signal while maintaining a stable operating temperature, comprising:

receiving a bias voltage and receiving the signal where the bias voltage is a direct current (DC) bias voltage, and the signal is a radio frequency (RF) signal;

applying the bias voltage to multiple bias resistances and outputting multiple voltages, where applying the DC bias voltage to the bias resistances maintains the stable operating temperature;

applying the RF signal to multiple signal bias networks and outputting multiple modified signals, wherein applying the RF signal to the multiple signal bias networks comprises:

applying the RF signal to a capacitance and a resistance connected in series;

where the capacitance isolates the RF input port and the multiple transistors from each of the multiple transistors; and where the resistance maximizes amplifier gain;

processing the modified multiple bias voltages and the multiple modified signals; and outputting a processed signal.

15. The method of claim 14, wherein the method further comprises receiving the RF signal.

16. The method of claim 15, wherein the method further comprises transmitting the amplified RF signal.

17. The method of claim 14, wherein the method further comprises transmitting the amplified RF signal.

\* \* \* \* \*

UNITED STATES PATENT AND TRADEMARK OFFICE
CERTIFICATE OF CORRECTION

PATENT NO. : 6,678,513 B2  Page 1 of 1
DATED : January 13, 2004
INVENTOR(S) : Glasbrener et al.

It is certified that error appears in the above-identified patent and that said Letters Patent is hereby corrected as shown below:

Column 7,
Line 57, please delete the word "so" and subtitute therefore -- to --.

Column 8,
Line 7, please delete "en" and subtitute therefore -- an --.
Line 15, please delete the first occurrence of "a".

Signed and Sealed this

Thirteenth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO.   : 6,678,513 B2
DATED        : January 13, 2004
INVENTOR(S)  : Glasbrener et al.

It is certified that error appears in the above-identified patent and that said Letters Patent is hereby corrected as shown below:

Column 7,
Line 57, please delete the word "so" and subtitute therefor -- to --.

Column 8,
Line 7, please delete "en" and subtitute therefore -- an --.
Line 15, please delete the first occurrence of "a".

This certificate supersedes Certificate of Correction issued April 13, 2004.

Signed and Sealed this

Thirteenth Day of July, 2004

JON W. DUDAS
*Acting Director of the United States Patent and Trademark Office*